United States Patent
Tamura et al.

(10) Patent No.: US 7,918,941 B2
(45) Date of Patent: Apr. 5, 2011

(54) CLEANING COMPOSITION

(75) Inventors: Atsushi Tamura, Wakayama (JP);
Yasunori Horio, Wakayama (JP)

(73) Assignee: Kao Corporation, Tokyo (JP)

( * ) Notice: Subject to any disclaimer, the term of this patent is extended or adjusted under 35 U.S.C. 154(b) by 242 days.

(21) Appl. No.: 12/225,742

(22) PCT Filed: Mar. 26, 2007

(86) PCT No.: PCT/JP2007/056158
§ 371 (c)(1),
(2), (4) Date: Sep. 29, 2008

(87) PCT Pub. No.: WO2007/116669
PCT Pub. Date: Oct. 18, 2007

(65) Prior Publication Data
US 2009/0312219 A1    Dec. 17, 2009

(30) Foreign Application Priority Data

Mar. 31, 2006 (JP) .................. 2006-098588
Dec. 22, 2006 (JP) .................. 2006-345763

(51) Int. Cl.
*C11D 3/20* (2006.01)

(52) U.S. Cl. ........................ 134/1.3; 510/175
(58) Field of Classification Search .................. 510/175; 134/1.3
See application file for complete search history.

(56) References Cited

U.S. PATENT DOCUMENTS

| 6,440,856 B1 | 8/2002 | Bessho et al. |
| 2003/0158059 A1 | 8/2003 | Sakai et al. |
| 2005/0202994 A1 * | 9/2005 | Baum et al. ............ 510/475 |
| 2006/0046949 A1 * | 3/2006 | Ito et al. .............. 510/475 |

FOREIGN PATENT DOCUMENTS

| JP | 5-43897 A | 2/1993 |
| JP | 9-3677 A | 1/1997 |
| JP | 10-245592 A | 9/1998 |
| JP | 11-116984 A | 4/1999 |
| JP | 11-181494 A | 7/1999 |
| JP | 2001-64679 A | 3/2001 |
| JP | 2002-69495 A | 3/2002 |
| JP | 2006-60243 A | 3/2006 |

OTHER PUBLICATIONS

Office Action mailed Jun. 23, 2010 in Chinese application No. 200780008708.X.

* cited by examiner

*Primary Examiner* — Gregory E Webb
(74) *Attorney, Agent, or Firm* — Birch, Stewart, Kolasch & Birch, LLP

(57) ABSTRACT

The present invention relates to a cleaning agent composition for use in cleaning a substrate for recording media, a substrate for photomask, or a substrate for flat panel display, a surface of which at least contains a metallic or glassy substrate moiety, the cleaning agent composition containing (I) a copolymer compound satisfying at least the following (i) to (iii): (i) a constituting unit A1 derived from acrylic acid is contained in an amount of 20% by mol or more of the entire constituting units; (ii) the constituting unit A1 derived from acrylic acid and a constituting A2 derived from 2-acrylamide-2-methylpropanesulfonic acid are contained in a total amount of 90% by mol or more of the entire constituting units; and (iii) the constituting unit A1 and the constituting unit A2 of the entire constituting units are in a content ratio [constituting unit A1 (% by mol)/constituting unit A2 (% by mol)] of from 91/9 to 95/5.

16 Claims, No Drawings

CLEANING COMPOSITION

TECHNICAL FIELD

The present invention relates to a cleaning agent composition for use in cleaning a substrate for recording media, a substrate for photomask, or a substrate for flat panel display, and a cleaning process of the substrate with the cleaning agent composition.

BACKGROUND ART

In recent years, hard disk drives which have been used in diversified applications such as personal computers and portable music players have been demanded to have a higher recording memory, and discs of smaller in size and lighter in weight. With the trends, especially, the recording densities of the recording media that have been used in hard disk drives have dramatically increased over the last five years, and the demands for cleanliness of the substrate surface have become very strict. Therefore, foreign substances, such as soils from oily components and fine particles, on a substrate surface have been demanded to be sufficiently cleaned.

In addition, in the field of semiconductors, especially, high integration and high speeds have been dramatically progressed during the recent 5 years or so. In the production steps of a semiconductor, if a pattern formation using a lithography step is performed on a photomask still having foreign substances, the circuit patterns as designed cannot be obtained, so that troubles such as wire defects are generated, whereby possibly causing worsening of qualities and lowering of production yields. The higher the degree of integration of the semiconductor element and the finer the circuit patterns, the more notably exhibited the tendency as described above. Therefore, in order to suppress worsening of qualities and lowering of production yields of the manufactured article due to the finer formation of the circuit patterns, it has been desired that foreign substances, such as soils from oily components and fine particles, on a surface of a photomask are sufficiently cleaned.

Furthermore, even in flat panel displays (which may be referred to herein as "FPD") represented by liquid crystal televisions and plasma televisions that have been rapidly growing in penetration rate in recent years, especially during the last five years or so, the degree of cleanliness required for the surface of the panel during the production steps has been increasing, with the advancement in the large-screened, and high-fineness panel sizes.

In view of the situations of the recent years as described above, cleanability of a cleaning agent composition which has been developed based on a technological situation of nearly 10 years before or even before that, for example, the cleaning agent compositions described in Patent Publications 1 to 3 is insufficient for obtaining the required surface quality.
Patent Publication 1: JP-A-Hei-5-43897
Patent Publication 2: JP-A-Hei-11-116984
Patent Publication 3: JP-A-Hei-11-181494

DISCLOSURE OF INVENTION

Problems to be Solved by the Invention

An object of the present invention is to provide a cleaning agent composition for use in cleaning a substrate for recording media, a substrate for photomask, or a substrate for flat panel display, capable of realizing surface qualities required for high densification of a recording medium, high integration and high speed of a semiconductor, or a large-scaled, high-fineness FPD.

Means to Solve the Problems

Specifically, the gist of the present invention relates to:
[1] a cleaning agent composition for use in cleaning a substrate for recording media, a substrate for photomask, or a substrate for flat panel display, a surface of which at least contains a metallic or glassy substrate moiety, the cleaning agent composition containing:
(I) a copolymer compound satisfying at least the following (i) to (iii):
(i) a constituting unit A1 derived from acrylic acid is contained in an amount of 20% by mol or more of the entire constituting units;
(ii) the constituting unit A1 derived from acrylic acid and a constituting A2 derived from 2-acrylamide-2-methylpropanesulfonic acid are contained in a total amount of 90% by mol or more of the entire constituting units; and
(iii) the constituting unit A1 and the constituting unit A2 of the entire constituting units are in a content ratio [constituting unit A1 (% by mol)/constituting unit A2 (% by mol)] of from 91/9 to 95/5;
[2] a cleaning agent composition for use in cleaning a substrate for recording media, a substrate for photomask, or a substrate for flat panel display, a surface of which at least contains a metallic or glassy substrate moiety, wherein the cleaning agent composition is prepared by blending:
(I) a copolymer compound satisfying at least the following (i) to (iii):
(i) a constituting unit A1 derived from acrylic acid is contained in an amount of 20% by mol or more of the entire constituting units;
(ii) the constituting unit A1 derived from acrylic acid and a constituting A2 derived from 2-acrylamide-2-methylpropanesulfonic acid are contained in a total amount of 90% by mol or more of the entire constituting units; and
(iii) the constituting unit A1 and the constituting unit A2 of the entire constituting units are in a content ratio [constituting unit A1 (% by mol)/constituting unit A2 (% by mol)] is from 91/9 to 95/5; and
[3] a cleaning process for a substrate for recording media, a substrate for photomask, or a substrate for flat panel display, a surface of which at least contains a metallic or glassy substrate moiety, with a cleaning agent composition as defined in the above [1] or [2], including the following step (a) or (b):
(a) immersing the substrate for recording media, the substrate for photomask, or the substrate for flat panel display in the cleaning agent composition; or
(b) ejecting the cleaning agent composition, thereby cleaning a surface of the substrate for recording media, the substrate for photomask, or the substrate for flat panel display, while contacting with the surface.

EFFECTS OF THE INVENTION

By cleaning a substrate for recording media, a substrate for photomask, or a substrate for flat panel display with the cleaning agent composition of the present invention, surface qualities required for high-densification of a recording medium, high-integration and high-speed of a semiconductor, or large-scaled, high-fineness FPD can be realized.

BEST MODE FOR CARRYING OUT THE INVENTION

The cleaning agent composition of the present invention for use in cleaning a substrate for recording media, a substrate for photomask, or a substrate for flat panel display, a surface of which at least contains a metallic or glassy substrate moiety (which may be hereinafter simply referred to as a "cleaning agent composition"), contains the following (I) or (II):

(I) one or more copolymer compounds (component A) wherein a constituting unit A1 derived from one or more compounds selected from the group consisting of acrylic acid, methacrylic acid, and maleic acid is contained in an amount of 20% by mol or more of the entire constituting units, provided that a copolymer compound (component a) containing the constituting unit A1 and a constituting unit A2 derived from 2-acrylamide-2-methylpropanesulfonic acid in a molar ratio (A1/A2) of from 90/10 to 95/5 is contained in an amount of 75% by weight or more of the copolymer compound; or (II) 1-Hydroxyethylidene-1,1-diphosphonic acid (which may be hereinafter referred to as "HEDP") and a nonionic surfactant represented by the following general formula (1) (which may be referred to herein as a "component B"), provided that HEDP and the component B are contained in the cleaning agent composition in a weight ratio, i.e. HEDP/component B, of from 1/20 to 1/5:

$$R^1-O-(EO)m(PO)n-H \quad (1)$$

wherein $R^1$ is an alkyl group having 8 to 18 carbon atoms, an alkenyl group having 8 to 18 carbon atoms, an acyl group having 8 to 18 carbon atoms, or an alkylphenol group having 14 to 18 carbon atoms; EO is an oxyethylene group; PO is an oxypropylene group; each of m and n is an average number of moles of EO and PO added, wherein m is a number of from 1 to 20, and n is a number of 0 to 20, wherein EO and PO is contained in a random or block form.

In the present invention, the cleaning agent composition containing the above (I) is referred to as a cleaning agent composition of an embodiment 1, and a cleaning agent composition containing the above (II) is referred to as a cleaning agent composition of an embodiment 2. By using the cleaning agent composition of the present invention containing a specified compound, a high degree of cleanliness required for a substrate to be cleaned can be realized. Here, the cleaning agent composition of the present invention may contain both of the above-mentioned (I) and (II).

1. Cleaning Agent Composition of Embodiment 1

One of the features of the cleaning agent composition of the embodiment 1 is in that the cleaning agent composition contains one or more copolymer compounds wherein a constituting unit A1 derived from one or more compounds selected from the group consisting of acrylic acid, methacrylic acid, and maleic acid is contained in an amount of 20% by mol or more of the entire constituting units (component A), provided that a copolymer compound (component a) containing the constituting unit A1 and a constituting unit A2 derived from 2-acrylamide-2-methylpropanesulfonic acid in a molar ratio (A1/A2) of from 90/10 to 95/5 is contained in an amount of 75% by weight or more of the copolymer compound. Having the above feature, the cleaning agent composition of the embodiment 1 can exhibit excellent effects in dissolution of an oily component, and dispersion and removal of fine particles, and especially in dispersion and removal of fine particles. Further, the cleaning agent composition of the embodiment 1 has little foaming upon use, thereby being excellent in cleaning operability.

<<Component A>>

The component A is a copolymer compound wherein a constituting unit A1 derived from one or more compounds selected from the group consisting of acrylic acid, methacrylic acid, and maleic acid is contained in an amount of 20% by mol or more of the entire constituting units.

Specific examples are acrylic acid copolymer compounds, methacrylic acid copolymer compounds, maleic acid copolymer compounds, acrylic acid-methacrylic acid copolymer compounds, acrylic acid-maleic acid copolymer compounds, methacrylic acid-dimethylaminomethacrylic ester copolymer compounds, methacrylic acid-methyl acrylic ester copolymer compounds, and the like.

In the cleaning agent composition of the embodiment 1, one or more copolymer compounds of the above-mentioned component A is used, from the viewpoint of dispersion and removal of fine particles, and the copolymer compound in an amount of 75% by weight or more is a copolymer compound (component a) containing the constituting unit A1 and a constituting unit A2 derived from 2-acrylamide-2-methylpropanesulfonic acid in a molar ratio (A1/A2) of from 90/10 to 95/5, and the component a is contained in an amount of preferably 90% by weight or more, and more preferably 100% by weight of the component A.

<<Component a>>

The component a is a copolymer compound containing a constituting unit A1 derived from one or more compounds selected from the group consisting of acrylic acid, methacrylic acid, and maleic acid in an amount of 20% by mol or more of the entire constituting units, and the constituting unit A1 and a constituting unit A2 derived from 2-acrylamide-2-methylpropanesulfonic acid are in a molar ratio (A1/A2) of from 90/10 to 95/5. By using the above-mentioned copolymer, it is considered that an excellent effect that a substrate to be cleaned can be cleaned in a state that the dispersibility of the cleaning agent accompanying an increase in zeta potential is excellent, while maintaining the rinsability of the cleaning agent, is exhibited.

The constituting unit A1 and the constituting unit A2 are contained in a total amount of 22% by mol of the entire constituting units of the component a. The total amount is preferably 80% by mol or more, more preferably 90% by mol or more, and even more preferably 100% by mol, from the viewpoint of enhancing the water solubility of the copolymer compound of the component a, and satisfying both of the prevention of fine particles from being aggregated and the prevention of the removability of fine particles from being worsened due to the lowering of the water solubility.

Since the copolymer compound of the component a containing A1 and A2 in the above ratio can provide the fine particles with an appropriate electric charge, it is considered to be effective in the prevention of fine particles from being aggregated.

The constituting unit A1 and the constituting unit A2 are contained in the entire constituting units of the component a in a ratio [constituting unit A1 (% by mol)/constituting monomer A2 (% by mol)] of from 90/10 to 95/5, preferably from 91/9 to 95/5, and more preferably from 91/9 to 93/7, from the viewpoint of satisfying both of the prevention of the fine particles from being aggregated and the prevention of the removability of the fine particles from being worsened due to the lowering of the water solubility. Here, in a case where a substrate to be cleaned is a substrate for recording media, the constituting unit A1 and the constituting unit A2 are contained in the entire constituting units of the component a in a ratio [constituting unit A1 (% by mol)/constituting unit A2 (% by mol)] of even more preferably from 91/9 to 95/5, and even more preferably from 91/9 to 93/7. In a case where a substrate to be cleaned is a substrate for photomask or a substrate for flat panel display, the constituting unit A1 and the constituting unit A2 are contained in a ratio of even more preferably from 91/9 to 95/5, and even more preferably from 91/9 to 93/7.

The copolymer compound of the component A has a weight-average molecular weight of preferably from 500 to 150,000, more preferably from 1000 to 100,000, and even more preferably from 1000 to 50,000, from the viewpoint of preventing the removability of fine particles from being lowered by the exhibition of the aggregation ability, and obtaining sufficient removability of the fine particles. The weight-average molecular weight of the copolymer compound of the component A can be obtained by, for example, gel permeation chromatography (GPC) under the following conditions.
(Conditions for GPC)
  Column: G4000PWXL+G2500PWXL (manufactured by Tosoh Corporation)
  Eluent: 0.2 M Phosphate buffer/$CH_3CN$=9/1 (volume ratio)
  Flow rate: 1.0 mL/min
  Column temperature: 40° C.
  Detection: RI
  Sample size: 0.2 mg/mL
  Standard substance: calculated as polyethylene glycol As the copolymer compound of the compound A mentioned above, a salt thereof may be used. The salt is not particularly limited, and specific examples are preferably alkali metal salts, such as sodium salts and potassium salts, and salts with a nitrogen-containing compound having a molecular weight of 300 or less. The nitrogen-containing compound having a molecular weight of 300 or less includes, for example, an amino alcohol formed by adding ethylene oxide, propylene oxide or the like to ammonia, an alkylamine, or a polyalkylpolyamine, the amino alcohol including monoethanolamine, diethanolamine, triethanolamine, methylethanolamine, monopropanolamine, dipropanolamine, tripropanolamine, methylpropanolamine, monobutanolamine, aminoethylethanolamine, and the like; quaternary ammonium salts such as tetramethylammonium hydroxide and choline; and the like.

The copolymer compounds of the component A are contained in a total amount of preferably from 0.001 to 30% by weight, more preferably from 0.01 to 20% by weight, even more preferably from 0.1 to 10% by weight, and still even more preferably from 1 to 10% by weight, of the cleaning agent composition of the embodiment 1, from the viewpoint of exhibiting sufficient removability, dispersion stability and wastewater treatment of the fine particles.

<<Water>>

The cleaning agent composition of the embodiment 1 may further contain water. The water includes, for example, ultrapure water, pure water, ion-exchanged water, distilled water, and the like, ultrapure water, pure water, and ion-exchanged water are preferred, and ultrapure water is more preferably used. Here, the pure water and the ultrapure water can be obtained by, for example, allowing tap water to pass through an activated charcoal, subjecting the treated water to ion exchange treatment, and further distilling the ion-exchanged water, and optionally irradiating with a given ultraviolet sterilization lamp or passing through a filter. For example, the electroconductivity at 25° C. is in many cases 1 μS/cm or less in pure water, and 0.1 μS/cm or less in ultrapure water. The water is contained in an amount of preferably from 70 to 99.999% by weight, more preferably from 80 to 99.99% by weight, and even more preferably from 90 to 99.9% by weight, of the cleaning agent composition of the embodiment 1, from the viewpoint of stability of the manufactured article.

<<pH>>

The pH of the cleaning agent composition of the embodiment 1 may be properly adjusted according to its cleaning purpose. From the viewpoint of more effectively removing metal impurities, it is preferable that the cleaning agent composition of the embodiment 1 is acidic. Specifically, it is preferable that a cleaning agent composition further contains one or more members selected from the group consisting of hydrochloric acid, sulfuric acid, nitric acid, hydrofluoric acid, formic acid, and acetic acid, the cleaning agent composition having a pH of 6 or less. In this case, it is more preferable that the cleaning agent composition has a pH of 4 or less. In addition, the cleaning agent composition has a pH of preferably 2 or more, and more preferably 3 or more, from the viewpoint of preventing a metal material or the like from being corroded.

Alternatively, it is preferable that the cleaning agent composition of the embodiment 1 is alkaline, from the viewpoint of more effectively removing fine particles. Specific examples are preferably a cleaning agent composition further containing one or more members selected from the group consisting of ammonia, amino alcohols, tetramethylammonium hydroxide, choline, potassium hydroxide, and sodium hydroxide, the cleaning agent composition having a pH within the range of from 9 to 14. Here, in a case where at least a material surface of a substrate to be cleaned is metallic, the cleaning agent composition has a pH of more preferably from 9 to 12, and in a case where the material surface is glassy, the cleaning agent composition has a pH of more preferably from 11 to 14. Here, the pH mentioned above is a pH of a cleaning agent composition at 25° C.

The above-mentioned amino alcohol includes, for example, mono ethanolamine, diethanolamine, triethanolamine, methylethanolamine, methyldiethanolamine, monopropanolamine, dipropanolamine, tripropanolamine, methylpropanolamine, methyldipropanolamine, aminoethylethanolamine, and the like, and methyldiethanolamine is preferred, from the viewpoint of stability of the manufactured article and environmental friendliness. The amino alcohol may be used alone or in a mixture of two or more kinds.

It is preferable that the cleaning agent composition of the embodiment 1 further contains a nonionic surfactant of the component B mentioned later, from the viewpoint of improving wetting penetrability to and dissolubility in an oily component. The component B is contained in an amount of preferably from 0.0005 to 15% by weight, more preferably from 0.005 to 10% by weight, and even more preferably from 0.05 to 5% by weight, of the cleaning agent composition of the embodiment 1.

The cleaning agent composition of the embodiment 1 may further contain HEDP or aminotrimethylenephosphonic acid, within the range that would not impair the properties of the present invention.

<<Other Optional Components>>

The cleaning agent composition of the embodiment 1 can be further blended with a silicone-based defoaming agent, a chelating agent such as EDTA, an alcohol, a glycol ether other than the component B, having an alkyl group, an alkenyl group, an acyl group, or an alkylphenol group having a low number of carbon atoms, a preservative agent, an antioxidant, or the like, within the range that would not impair the properties of the present invention.

The glycol ether other than the compound B that can be blended with the cleaning agent composition of the embodiment 1 includes diethylene glycol monomethyl ether, diethylene glycol monoethyl ether, diethylene glycol monobutyl ether, diethylene glycol monohexyl ether, diethylene glycol monophenyl ether, triethylene glycol monophenyl ether, and the like. Among them, diethylene glycol monobutyl ether and triethylene glycol monophenyl ether are preferably used, from the viewpoint of providing sufficient wettability to a material surface and from the viewpoint of improving stability of the manufactured article, such as water solubility.

The cleaning agent composition of the embodiment 1 can be prepared by blending each of the above components according to a known method, and mixing the components.

An object to be cleaned with the cleaning agent composition of the embodiment 1 is a substrate for recording media, a substrate for photomask, or a substrate for flat panel display, a surface of which at least constitutes a metallic or glassy substrate moiety.

The substrate for recording media refers to a substrate to be used for recording media by forming a metallic substrate moiety on its surface, serving as a magnetic recording region, in the state of a thin film by spattering or the like. The substrate includes, for example, a disk-shaped substrate provided with a Ni—P plating on a surface of an aluminum substrate, or a disk-shaped substrate made of a chemically reinforced glass, and the like. In addition, the metallic substrate which can constitute the surface includes, for example, a cobalt alloy made from cobalt and chromium, tantalum, platinum, or the like; and the like.

The substrate for photomask refers to a glassy substrate used as a material, or a substrate on which surface a film is formed with a metallic substrate, in the step of manufacturing a master (photomask) of a circuit pattern used upon exposure of a circuit pattern of a semiconductor element in the lithographic process. The metallic substrate which can constitute the surface includes chromium, molybdenum, and the like, and the glassy substrate includes silica glass, and the like.

The substrate for flat panel display refers to a glassy substrate used as a material for panel display, or a substrate on which surface a film is formed with a metallic substrate, in the step of manufacturing liquid crystal television and plasma television. The metallic substrate which can constitute the surface includes a transparent electrode thin film (ITO film: indium-tin oxide film, or the like), and the like, and the glassy substrate includes a non-alkaline glass, and the like.

By using the cleaning agent composition of the embodiment 1 in, for example, a cleaning process described later, excellent dissolution of an oily component and removal of fine particles and the like can be performed on an object to be cleaned mentioned above.

Here, the cleaning agent composition of the embodiment 1 may be used by properly diluting the cleaning agent composition with water or the like upon cleaning an object to be cleaned. The active ingredient in the cleaning agent composition upon dilution, namely the component A, is contained in a total amount of preferably from 0.001 to 5% by weight, more preferably from 0.005 to 3% by weight, and even more preferably from 0.01 to 2% by weight.

In addition, in a case where a cleaning agent composition of the embodiment 1 contains a component B, it is preferable that the cleaning agent composition is diluted upon use, so that the component A and the component B are contained in a total amount of preferably from 0.001 to 5% by weight, more preferably from 0.005 to 3% by weight, and even more preferably from 0.01 to 2% by weight.

2. Cleaning Agent Composition of Embodiment 2

It is preferable that the cleaning agent composition of the embodiment 2 contains 1-hydroxyethylidene-1,1-diphosphonic acid and a nonionic surfactant (component B) represented by the general formula (1) in a specified weight ratio. Since the cleaning agent composition has the above feature, the features of each of the components are exhibited synergistically, thereby exhibiting excellent cleanability; therefore, the cleaning agent composition of the embodiment 2 can exhibit excellent effects in the dissolution of an oily component and the removal of fine particles, and especially in the dissolution of an oily component.

<<1-Hydroxyethylidene-1,1-diphosphonic Acid>>

In the present invention, as the 1-hydroxyethylidene-1,1-diphosphonic acid, a salt of 1-hydroxyethylidene-1,1-diphosphonic acid may be used. The salt includes ammonium salts, salts of amino alcohols, salts with choline, salts with tetramethylammonium hydroxide, salts with various primary to quaternary, organic amines, alkali metal salts, such as sodium salts and potassium salts, alkaline earth metal elements such as calcium salts, and the like.

In a case where the salt of the 1-hydroxyethylidene-1,1-diphosphonic acid is used, an ammonium salt, a salt with an amino alcohol, a salt with choline, a salt with tetramethylammonium hydroxide, a potassium salt, or the like is preferred, from the viewpoint of stability of a manufactured article.

<<Component B>>

The nonionic surfactant, which is the component B, is represented by the following general formula (1):

$$R^1\text{—O-(EO)}m\text{(PO)}n\text{-H} \qquad (1)$$

wherein $R^1$ is an alkyl group having 8 to 18 carbon atoms, an alkenyl group having 8 to 18 carbon atoms, an acyl group having 8 to 18 carbon atoms, or an alkylphenol group having 14 to 18 carbon atoms; EO is an oxyethylene group; PO is an oxypropylene group; each of m and n is an average number of moles of EO and PO added, in which m is a number of from 1 to 20, and n is a number of 0 to 20, wherein EO and PO are contained in a random or block form.

In the general formula (1), $R^1$ is an alkyl group having 8 to 18 carbon atoms, an alkenyl group having 8 to 18 carbon atoms, an acyl group having 8 to 18 carbon atoms, or an alkylphenol group having 14 to 18 carbon atoms. From the viewpoint of cleanability, an alkyl group having 8 to 14 carbon atoms, an alkenyl group having 8 to 14 carbon atoms, an acyl group having 8 to 14 carbon atoms, or an alkylphenol group having 14 to 16 carbon atoms are preferred. From the viewpoint of satisfying all of cleanability, wastewater treatment, and environmental friendliness, an alkyl group having 8 to 14 carbon atoms is more preferred.

(EO)m(PO)n may be constituted by an oxyethylene group alone, or the moiety may be constituted by both an oxyethylene group and an oxypropylene group. In a case where the moiety is constituted by both, an oxyethylene group and an oxypropylene group may be contained in a random form, or they may be contained in a block form. In addition, in a case where an oxyethylene group and an oxypropylene group are contained in a random or block form, a moiety in which the oxyethylene group and the oxypropylene group are in a molar ratio [oxyethylene group/oxypropylene group] within the range of from 9.5/0.5 to 5/5 is preferred, from the viewpoint of satisfying both of dissolubility in an oily component and a high water solubility. In addition, m is preferably from 1 to 15, and more preferably from 1 to 10, from the viewpoint of satisfying both of water solubility and low-foamability, and n is preferably from 1 to 15, and more preferably from 1 to 10, from the viewpoint of satisfying both of water solubility and low-foamability, and m+n is preferably from 1 to 30, and more preferably from 1 to 20.

Specific examples of the compound represented by the general formula (1) include compounds prepared by adding an oxyethylene group, or an oxyethylene group and an oxypropylene group, to an alcohol or a phenol, such as 2-ethylhexanol, octanol, decanol, isodecyl alcohol, tridecyl alcohol, lauryl alcohol, myristyl alcohol, stearyl alcohol, oleyl alcohol, octylphenol, nonylphenol, or dodecylphenol; and the like. As mentioned above, the oxyethylene group may be used alone, or the oxyethylene group may be used together with an oxypropylene group. The compound represented by the general formula (1) may be used alone, or the compound may be used as a mixture of two or more kinds.

As the nonionic surfactant, which is a component B, specifically, the following ones can be used. Specifically, $CH_jH_{2j+1}$—O-$(EO)_p$—H, $C_jH_{2j+1}$—O-$(EO)_q(PO)_r$—H (provided that EO and PO are added in a block form), $C_jH_{2j+1}$—O—$(PO)_q(EO)_r$—H (provided that EO and PO are added in a block form), $C_jH_{2j+1}$—O-$(EO)_s(PO)_t(EO)_u$—H (provided that EO and PO are added in a block form), $C_jH_{2j+1}$—O-$(EO)_q(PO)_r$—H (provided that EO and PO are added in a random form), or the like, can be preferably used as the nonionic surfactant, which is the component B, wherein EO is an oxyethylene group ($C_2H_4O$); PO is an oxypropylene group ($C_3H_6O$); j is a number of from 8 to 18; each of p, q, r, s, t and u is an average number of moles of EO or PO added, wherein p is a number of from 1 to 20, q is a number of from 1 to 20, r is a number of from 1 to 20, s is a number of from 1 to 10, t is a number of 1 to 10, and u is a number of 1 to 10.

Further, in a case where the cleaning agent of the present invention contains a nonionic surfactant, it is preferable to contain a p-toluenesulfonate (preferably a Na salt), from the viewpoint of improving rinsability and stability of a manufactured article of the cleaning agent. The p-toluenesulfonate serves to increase a cloud point of a nonionic surfactant, thereby increasing the water solubility of the nonionic surfactant itself, and making it possible to reduce the remnant of a nonionic surfactant upon rinsing; therefore, it is considered that the p-toluenesulfonate improves rinsability, in a case where, for example, a nonionic surfactant is contained in the embodiment 1 of the present invention, or in a case of using together with a nonionic surfactant of the formula (1) in the embodiment 2. Further, in the embodiment 1 and the embodiment 2 of the present invention, it is preferable to contain sodium dodecylbenzenesulfonate, from the viewpoint of enhancing dispersibility of organic fine particles (especially fine particles composed of fine slices derived from nylon material), and improving the removability of the fine particles.

In addition, the HEDP and the component B are contained in the cleaning agent composition of the embodiment 2 in a weight ratio (HEDP/component B) of preferably from 1/20 to 1/5, more preferably from 1/15 to 1/7, and even more preferably from 1/12 to 1/8, from the viewpoint of even more highly exhibiting the synergistic effects on the removability of fine particles and the removability of an oily component.

The HEDP and the component B are contained in a total amount of preferably from 0.001 to 30% by weight, more preferably from 0.01 to 25% by weight, even more preferably from 0.1 to 20% by weight, and still even more preferably from 1 to 15% by weight, of the cleaning agent composition of the embodiment 2, from the viewpoint of exhibiting sufficient removability of fine particles and dispersion stability, and sufficient wetting penetrability to and dissolubility in an oily component.

<<Water>>

The cleaning agent composition of the embodiment 2 may further contain water. As the water, the same ones as those of the cleaning agent composition of the embodiment 1 can be exemplified. In addition, the water is contained therein in an amount of preferably from 70 to 99.999% by weight, more preferably from 75 to 99.99% by weight, and even more preferably from 80 to 99.9% by weight, from the viewpoint of stability of the manufactured article.

<<pH>>

In the cleaning agent composition of the embodiment 2, the pH may be the same as that in the cleaning agent composition of the embodiment 1.

The amino alcohol which can be used in the adjustment of pH includes, for example, monoethanolamine, diethanolamine, triethanolamine, methylethanolamine, methyldiethanolamine, monopropanolamine, dipropanolamine, tripropanolamine, methylpropanolamine, methyldipropanolamine, aminoethylethanolamine, and the like, and monoethanolamine is preferred, from the viewpoint of stability of the manufactured article. The amino alcohol may be used alone, or as a mixture of two or more kinds.

It is preferable that the cleaning agent composition of the embodiment 2 further contains a copolymer compound of the above-mentioned component a or a salt thereof, from the viewpoint of exhibiting an even higher removability of fine particles and dispersion stability. The component a is contained in an amount of preferably from 0.001 to 30% by weight, more preferably from 0.01 to 20% by weight, and even more preferably from 0.1 to 10% by weight, of the cleaning agent composition of the embodiment 2.

<<Other Optional Components>>

The cleaning agent composition of the embodiment 2 can be blended with a silicone-based defoaming agent, a chelating agent such as EDTA, an alcohol, a glycol ether other than the component B, a preservative agent, an antioxidant, or the like, within the range that would not impair the properties of the present invention.

The glycol ether other than the compound B that can be contained in the cleaning agent composition of the embodiment 2 includes the same ones as those exemplified in the cleaning agent composition of the embodiment 1. Among them, diethylene glycol monobutyl ether and triethylene glycol monophenyl ether are preferably used, from the viewpoint of giving sufficient wettability to a material surface of a substrate to be cleaned and from the viewpoint of improving stability of the manufactured article, such as water solubility.

The cleaning agent composition of the embodiment 2 can be prepared by blending each of the above components according to a known method, and mixing the components.

An object to be cleaned with the cleaning agent composition of the embodiment 2 can be exemplified by the same ones as the object to be cleaned with the cleaning agent composition of the embodiment 1.

By using the cleaning agent composition of the embodiment 2 in, for example, a cleaning process described later, excellent dissolution of an oily component and removal of fine particles and the like can be performed on an object to be cleaned mentioned above.

Here, the cleaning agent composition of the embodiment 2 may be used by properly diluting the cleaning agent composition with water or the like upon cleaning an object to be cleaned. The active ingredients in the cleaning agent composition upon dilution, namely the HEDP and the component B, are contained in a total amount of preferably from 0.001 to 5% by weight, more preferably from 0.005 to 3% by weight, and even more preferably from 0.01 to 2% by weight.

In addition, in a case where a cleaning agent composition of the embodiment 2 contains a component a, it is preferable that the cleaning agent composition is diluted upon use, so that the HEDP, the component B and the component a are contained in a total amount of preferably from 0.001 to 5% by weight, more preferably from 0.005 to 3% by weight, and even more preferably from 0.01 to 2% by weight.

3. Cleaning Process

The cleaning process of the present invention is a cleaning process for a substrate for recording media, a substrate for photomask, or a substrate for flat panel display, a surface of which at least contains a metallic or glassy substrate moiety, with a cleaning agent composition as defined in the embodiment 1 or the embodiment 2 mentioned above, including the following step (a) or (b):

(a) immersing the substrate for recording media, the substrate for photomask, or the substrate for flat panel display in the cleaning agent composition; or
(b) ejecting the cleaning agent composition, thereby cleaning a surface of the substrate for recording media, the substrate for photomask, or the substrate for flat panel display, while contacting with the surface.

In the step (a), the conditions upon immersion are not particularly limited, and the conditions include, for example, immersion conditions of from 20° to 100° C. for 10 seconds to 30 minutes. In addition, it is preferable that the immersion is carried out under conditions that the ultrasonic waves are vibrated, from the viewpoint of removability of fine particles and dispersibility. The ultrasonic waves have a frequency of preferably from 20 to 2000 kHz, more preferably from 100 to 2000 kHz, and even more preferably from 1000 to 2000 kHz.

In the step (b), it is preferable that cleaning is carried out by ejecting a cleaning agent composition vibrated with ultrasonic waves and contacting the cleaning agent composition with a surface of a substrate to be cleaned, from the viewpoint of enhancing cleanability of fine particles and dissolubility of an oily component, or that the cleaning is carried out by contacting a cleaning brush with a surface of a substrate to be cleaned in the presence of an ejected cleaning agent composition. It is more preferable that the cleaning is carried out by ejecting a cleaning agent composition vibrated with ultrasonic waves, and contacting a cleaning brush with a surface of a substrate to be cleaned in the presence of the ejected cleaning agent composition.

As a means of ejecting a cleaning agent composition, a known means such as a spray nozzle can be used. Also, a cleaning brush is not particularly limited, and, for example, a known one, such as a nylon brush or a PVA sponge, can be used. The frequency of the ultrasonic waves may be the same as those exemplified in the step (a).

In addition, the cleaning process of the present invention, in addition to the above step (a) or (b), the cleaning process may include one or more steps using a known cleaning means such as oscillation cleaning, cleaning utilizing the rotation of a spinner or the like, or a paddle cleaning.

Upon cleaning with the cleaning agent composition of the present invention, it is preferable that the cleaning is carried out by adjusting the amount of the component (I) or (II) contained to preferably from 0.001 to 5% by weight, more preferably from 0.005 to 3% by weight, and even more preferably from 0.01 to 2% by weight, from the viewpoint of cleanability of fine particles and an oily component.

In addition, in a case where the cleaning agent composition of the present invention contains HEDP, a component a and a component B, it is preferable that the cleaning is carried out with a total amount of the HEDP, the component a and the component B contained in the cleaning agent composition in an amount of from 0.001 to 5% by weight, it is more preferable that the cleaning is carried out with a total amount of from 0.005 to 3% by weight, and it is even more preferable that the cleaning is carried out with a total amount of from 0.01 to 2% by weight, from the viewpoint of removability and cleanability of fine particles.

In addition, the substrate to be cleaned may be cleaned one piece at a time in a single cleaning procedure, or a plural pieces may be cleaned. Also, the number of cleaning vessels used upon cleaning may be one or a plural. The temperature of the cleaning agent composition upon cleaning is not particularly limited, and it is preferable that the temperature is within the range of from 20° to 100° C., from the viewpoint of safety and operability.

EXAMPLES

1. Preparation of Cleaning Agent Compositions

Each of the components was blended and mixed so as to have each of the compositions listed in Tables 1 and 2, and the pHs of the compositions were adjusted as occasion demands, to give cleaning agent compositions of Example 1 to 9 and Comparative Examples 1 to 8. Here, the following cleanability test was conducted using a dilution prepared by diluting each of the resulting cleaning agent composition with ultrapure water in a dilution fold listed in Tables 1 and 2.

2. Cleanability Test of Substrates for Recording Media

A substrate to be cleaned stained with fine particles such as abrasive grains derived from a slurry and polishing debris derived from substrate materials was prepared by polishing a substrate with a general slurry (a polishing liquid). The cleanability against the fine particles of the cleaning agent composition was evaluated using the substrate.

2-1. Preparation of Substrate to be Cleaned (1) Substrates for Recording Media of which Surface is Constituted by Metallic Substrate A substrate obtained by further polishing a Ni—P plated substrate (outer diameter: 95 mmϕ, inner diameter: 25 mmϕ, thickness: 1.27 mm, surface roughness (Ra): 1 nm), previously roughly polished with a slurry containing an alumina abrasive, under the following polishing conditions was provided as a substrate to be cleaned.

<Polishing Conditions>

Polishing machine: Double-sided 9B Polishing Machine (manufactured by SPEEDFAM CO., LTD.)

Polishing pad: Suede type (thickness: 0.9 mm, average pore size: 30 μm, manufactured by FUJIBO)

Polishing liquid: Colloidal silica slurry (Product Number: Memolead 2P-2000, manufactured by Kao Corporation)

Main polishing; a load of 100 g/cm$^2$, time of 300 seconds, and a flow rate of polishing liquid of 100 mL/min Water rinsing: a load of 30 g/cm$^2$, time of 20 seconds, and a flow rate of rinsing water: about 2 L/min (2) Substrates for Recording Media of which Surface is Constituted by Glassy Substrate A substrate obtained by further polishing a glassy substrate made of an aluminosilicate (outer diameter: 65 mmϕ, inner diameter: 20 mmϕ, and thickness: 0.635 mm) obtained by previously performing a two-step polishing with a slurry containing cerium oxide abrasives, under the following polishing conditions was provided as a substrate to be cleaned.

<Polishing Conditions>

Polishing machine: Double-sided 9B Polishing Machine (manufactured by SPEEDFAM CO., LTD.)

Polishing pad: Suede type (thickness: 0.9 mm, average pore size: 30 μm, manufactured by FUJIBO)

Polishing liquid: Colloidal silica slurry (Product Number: Memolead GP2-317, manufactured by Kao Corporation)

Pre-polishing; a load of 60 g/cm$^2$, time of 60 seconds, and a flow rate of polishing liquid of 100 mL/min Main polishing; a load of 100 g/cm², time of 900 seconds, and a flow rate of polishing liquid of 100 mL/min Water rinsing: a load of 30 g/cm², time of 300 seconds, and a flow rate of rinsing water: about 2 L/min 2-2. Cleaning The substrate to be cleaned prepared in 2-1. was cleaned with a cleaning apparatus under the following conditions.

(1) Cleaning: Cleaning was carried out for 60 seconds by ejecting a cleaning agent composition at an ambient temperature to a substrate to be cleaned held at three points with rollers, and pressing a cleaning brush against both sides of the substrate, along the inner diameter and the outer diameter of the substrate, in the presence of the cleaning agent composition, while rotating the cleaning brush at 300 rpm.

(2) Rinsing: Rinsing was carried out for 60 seconds by ejecting a ultrapure water at an ambient temperature to a substrate after the cleaning (1) held at three points with rollers, and pressing a cleaning brush against both sides of the substrate, the inner diameter, and the outer diameter, while rotating the cleaning brush at 300 rpm.

(3) Drying: A drip-drying was carried out for 30 seconds by subjecting a substrate after the rinsing (2) held at spin chuck to a high-speed rotation at 3000 rpm.

2-3. Evaluation of Cleanability of Fine Particles

The cleanability of fine particles on the surface of the substrate after cleaning in 2-2. was evaluated in accordance with the following method. The results are shown in Tables 1 and 2.

(1) Method for Evaluating Substrate for Recording Media of which Surface was Constituted by Metallic Substrate A substrate after cleaning was observed with a dark-field microscope with an objective lens at a magnification of 100 folds (field scope: a square of about 100 μm each side), and the number of bright spots observed within the observation field was counted as the number of residual fine particles on the surface of the substrate. The observations were made on 5 pieces of substrates at an inner circumferential part, a central part, and an outer circumferential part of the substrates randomly on 10 spots each, a total of 150 spots (10 spots×3 (parts)×5 (pieces)=150 spots). The cleanability of fine particles was evaluated in 4 ranks, according to the number of entire bright spots in the 150 spots observed, on the basis of the following evaluation criteria.

<Evaluation Criteria for Cleanability of Fine Particles>
◎: The number of entire bright spots is 0.
○: The number of entire bright spots is 1 to 2.
Δ: The number of entire bright spots is 3 to 5.
X: The number of entire bright spots is 6 or more.
Here, acceptable products are those of which cleanability of fine particles is ○ or ◎.

(2) Method for Evaluating Substrate for Recording Media of which Surface was Constituted by Glassy Substrate A substrate after cleaning was observed with a scanning electron microscope under a magnification of 1000 folds (field scope: a square of about 100 μm each side), and the number of residual fine particles on the surface of the substrate observed within the observation field was counted. The observations were made on 5 pieces of substrates at an inner circumferential part, a central part, and an outer circumferential part of the substrates randomly on 10 spots each, a total of 150 spots (10 spots×3 (parts)×5 (pieces)=150 spots). The cleanability of fine particles was evaluated in 4 ranks, according to the number of entire fine particles in the 150 spots observed, on the basis of the following evaluation criteria.

<Evaluation Criteria for Cleanability of Fine Particles>
◎: The number of entire fine particles is 0.
○: The number of entire fine particles is 1 to 2.
Δ: The number of entire fine particles is 3 to 5.
X: The number of entire fine particles is 6 or more.
Here, acceptable products are those of which cleanability of fine particles is ○ or ◎.

3. Cleanability Test for Substrates for Photomask

Substrates to be cleaned soiled with fingerprints (sebum), which are generally artificial soils, and lubricants (greases), which are general environmental soils from a transportation apparatus, or the like, among various oily soils deposited on surfaces of substrates for photomask were prepared, and the cleanability of the cleaning agent composition against the oily soils was evaluated with the substrate.

3-1. Preparation of Substrates to be Cleaned (1) Substrates for Photomask of which Surface was Constituted by Metallic Substrate A substrate obtained by depositing fingerprints (sebum) all over the surface of a silica glass substrate (about 25×50 mm) on which surface a chromium thin film was formed, and a silica glass substrate (about 25×50 mm) on which surface a chromium thin film was formed, were immersed in 100 ml of a methylene chloride solution containing 5 g of grease used in a transportation apparatus for a glass substrate. Thereafter, the immersed substrates were air-dried, to provide substrates of which entire moiety was deposited with the grease as substrates to be cleaned.

(2) Substrates for Photomask Surface of which was Constituted by Glassy Substrate A silica glass substrate (about 25×50 mm), the entire surface of which was deposited with fingerprints (sebum), and a silica glass substrate (about 25×50 mm), the entire moiety of which was deposited with the grease, immersed in a 100 ml methylene chloride solution containing 5 g of grease, followed by air-drying, were provided as substrates to be cleaned.

3-2. Cleaning

The substrate to be cleaned prepared in 3-1. was cleaned under the following conditions.

(1) Cleaning: One piece of a substrate to be cleaned was immersed in 80 ml of a cleaning agent composition at 25° C. to which ultrasonic waves (at 35 kHz) were irradiated, and the substrate was allowed to stand therein for 30 seconds.

(2) Rinsing: The substrate after the cleaning (1) taken out from the cleaning agent composition was immersed in 80 ml of ultrapure water at 25° C. for 30 seconds.

(3) Drying: The substrate after the rinsing (2) was dried with a nitrogen blow.

3-3. Evaluation for Cleanability

The cleanability against oily soils on a surface of the substrate after cleaning of 3-2. was evaluated by the following methods. The results are shown in Tables 1 and 2.

(1) Evaluation for Cleanability Against Fingerprints (Sebum)

Five pieces of substrates after cleaning were observed for the overall substrates (about 25×50 mm) at a magnification of 20 folds with an optical microscope. The cleanability of the fingerprints (sebum) was evaluated in 4 ranks according to observed residual states of the fingerprints (sebum) and on the basis of the following evaluation criteria.

<Evaluation Criteria for Cleanability Against Fingerprints (Sebum)>
◎: Residues of fingerprints (sebum) are not confirmed at all.
○: Very small amount of residues of fingerprints (sebum) are confirmed.
Δ: A part of residues of fingerprints (sebum) is confirmed.

X: Much residues of fingerprints (sebum) are found.

(2) Evaluation for Cleanability Against Lubricant (Grease)

Five pieces of substrates after cleaning were visually observed in the overall substrate (about 25×50 mm). The cleanability against a lubricant (grease) was evaluated in 4 ranks according to the residual states of the observed greases and on the basis of the following evaluation criteria.

<Evaluation Criteria for Cleanability Against Grease>
◎: Residues of grease are not confirmed at all.
○: Very small amount of residues of grease are confirmed.
Δ: A part of residues of grease is confirmed.
X: Much residues of grease are found.

Here, acceptable products are those of which cleanability of fingerprints and grease is ○ or ◎.

4. Cleanability Test for Substrates for Flat Panel Display

Substrates to be cleaned soiled with fingerprints (sebum), which are generally artificial soils, and lubricants (greases), which are general environmental soils from a transportation apparatus, or the like, among various oily soils deposited on surfaces of substrates for flat panel display were prepared, and the cleanability of the cleaning agent composition against the oily soils was evaluated with the substrate.

4-1. Preparation of Substrates to be Cleaned (1) Substrates for Flat Panel Display of which Surface was Constituted by Metallic Substrate Regarding a non-alkaline glass substrate (25×50 mm) on which a transparent electrode film (ITO film: indium-tin oxide film) was formed, a substrate on which entire surface was deposited with fingerprints (sebum), and a substrate of which entire moiety was deposited with grease were prepared in the same manner as in item (1) of 3-1. as substrates to be cleaned.

(2) Substrates for Flat Panel Display Surface of which was Constituted by Glassy Substrate Regarding a non-alkaline glass substrate (25×50 mm), a substrate of which entire surface was deposited with fingerprints (sebum), and a substrate of which entire moiety was deposited with grease were prepared in the same manner as in item (1) of 3-1. as substrates to be cleaned.

4-2. Cleaning

The substrates to be cleaned prepared in 4-1. were cleaned in the same manner as in 3-2.

4-3. Evaluation for Cleanability

The cleanability of oily soils on a surface of a substrate after the cleaning of 4-2. was evaluated in the same manner as in 3-3. The results are shown in Tables 1 and 2.

Here, acceptable products are those of which cleanability of fingerprints and grease is ○ or ◎.

TABLE 1

| | | | Examples | | | | | | | | |
|---|---|---|---|---|---|---|---|---|---|---|---|
| | | | 1 | 2 | 3 | 4 | 5 | 6 | 7 | 8 | 9 |
| | | | Composition (% by weight) | | | | | | | | |
| Copolymer | Na salt of acrylic acid/2-acrylamide-2-methyl-propanesulfonic acid (92 mol %/8 mol %) copolymer compound, weight-average molecular weight: 12000 (calculated as polyethylene glycol) | | 2.00 | | 2.00 | 2.00 | 2.00 | 2.00 | 2.00 | 2.00 | 0.80 |
| | Na salt of acrylic acid/2-acrylamide-2-methyl-propanesulfonic acid (94.2 mol %/5.8 mol %) copolymer compound, weight-average molecular weight: 12000 (calculated as polyethylene glycol) | | | 2.00 | | | | | | | |
| 1-Hydroxyethylidene-1,1-diphosphonic Acid (HEDP) | | | | | | | | | 1.20 | 1.20 | 4.20 |
| C12-14 O (EO)5(PO) 1.5 (EO) 5H | | | | | | 5.00 | 5.00 | | 12.50 | 5.00 | 2.00 |
| Diethylene glycol monobutyl ether | | | | | 5.00 | | | 5.00 | | | |
| Monoethanolamine | | | | | | | | | 2.30 | 2.50 | |
| Methyldiethanolamine | | | 0.15 | 0.15 | 0.15 | | | | | | |
| Potassium hydroxide | | | | | | 0.03 | 3.00 | 3.00 | | | 4.80 |
| Sodium p-toluenesulfonate | | | | | | | | | | 2.50 | 10.00 |
| Sodium dodecylbenzenesulfonate | | | | | | | | | | | 0.90 |
| Ultrapure Water | | | 97.85 | 97.85 | 92.85 | 92.97 | 90.00 | 90.00 | 82.00 | 86.80 | 77.30 |
| HEDP/Component B (weight ratio) | | | | | | | | | 1/10 | 1/4 | 2/1 |
| pH (25° C.) | | | 10.0 | 10.0 | 10.0 | 11.6 | 13.6 | 13.6 | 9.9 | 10.0 | 12.6 |
| Dilution fold upon evaluation of cleanability | | | 100 | 100 | 100 | 100 | 100 | 100 | 100 | 100 | 100 |

| Substrate to be cleaned | Surface Material | Cleaning Process | Evaluation | | | | | | | | |
|---|---|---|---|---|---|---|---|---|---|---|---|
| Substrate for recording media | Metal (Ni—P) | Brush-scrub cleaning | Cleanability of fine particles | ◎ | ◎ | ◎ | ◎ | ◎ | ◎ | ◎ | ◎ | ◎ |
| | Glass (chemically reinforced glass) | | Cleanability of fine particles | ○ | ○ | ○ | ◎ | ◎ | ◎ | ○ | ○ | ◎ |
| Substrate for photomask | Metal (Cr) | Ultrasonic immersion cleaning | Cleanability of fingerprints (sebum) | ○ | ○ | ◎ | ◎ | ◎ | ◎ | ◎ | ◎ | ◎ |
| | Glass (Silica glass) | | Cleanability of lubricant (grease) | ○ | ○ | ◎ | ◎ | ◎ | ◎ | ◎ | ◎ | ◎ |
| | | | Cleanability of fingerprints (sebum) | ○ | ○ | ○ | ◎ | ◎ | ◎ | ◎ | ◎ | ◎ |
| | | | Cleanability of lubricant (grease) | ○ | ○ | ○ | ◎ | ◎ | ○ | ◎ | ◎ | ◎ |
| Substrate for flat panel display (FPD) | Metal (ITO: Indium-Tin Oxide) | Ultrasonic immersion cleaning | Cleanability of fingerprints (sebum) | ○ | ○ | ○ | ◎ | ◎ | ◎ | ◎ | ◎ | ◎ |
| | | | Cleanability of lubricant (grease) | ○ | ○ | ◎ | ◎ | ◎ | ◎ | ◎ | ◎ | ◎ |
| | Glass (non-alkaline glass) | | Cleanability of fingerprints (sebum) | ○ | ○ | ○ | ◎ | ◎ | ◎ | ◎ | ◎ | ◎ |
| | | | Cleanability of lubricant (grease) | ○ | ○ | ○ | ◎ | ◎ | ○ | ◎ | ◎ | ◎ |

TABLE 2

| | | | Comparative Examples | | | | | | | |
|---|---|---|---|---|---|---|---|---|---|---|
| | | | 1 | 2 | 3 | 4 | 5 | 6 | 7 | 8 |
| | | | Composition (% by weight) | | | | | | | |
| Copolymer | Acrylic acid/methallylsulfonic acid (85% by wt./15% by wt.) copolymer compound, weight-average molecular weight = 8000 (calculated as polyethylene glycol) | | 4.00 | | | | | | | |
| | Ammonium salt of acrylic acid/(EO) 5 acrylic ester (70% by mol/30% by mol) copolymer compound, weight-average molecular weight = 7000 (calculated as polyethylene glycol) | | | 2.00 | | | | | | |
| | Na salt of acrylic acid/2-acrylamide-2-methylpropanesulfonic acid (85% by wt./15% by wt.) copolymer compound, weight-average molecular weight = 15000 (calculated as polyethylene glycol) | | | | | 2.00 | | | | |
| | Na salt of acrylic acid/2-acrylamide-2-methylpropanesulfonic acid (89.6% by wt./10.4s % by wt.) copolymer compound, weight-average molecular weight = 15000 (calculated as polyethylene glycol) | | | | | | 2.00 | | | |
| | Na salt of acrylic acid/2-acrylamide-2-methylpropanesulfonic acid (96.3% by wt./3.7% by wt.) copolymer compound, weight-average molecular weight = 12000 (calculated as polyethylene glycol) | | | | | | | 2.00 | | |
| Ammonium salt of diethylenetriaminepenta(methylene-phosphonic acid) | | | | | 5.00 | | | | | |
| Triethylene glycol monophenyl ether | | | | | 5.00 | | | | | |
| 1-Hydroxyethylidene-1,1-diphosphonic Acid (HEDP) | | | | | | | | | 0.50 | 1.20 |
| C12-14 O (EO)5(PO) 1.5(EO) 5H | | | | | | | | | 12.50 | 4.80 |
| Methyldiethanolamine | | | | | | 0.15 | 0.15 | 0.15 | | |
| Monoethanolamine | | | | | | | | | 0.95 | 2.30 |
| Sodium hydroxide | | | 3.00 | | | | | | | |
| Sodium metasilicate (nonahydrate) | | | 12.00 | | | | | | | |
| C12 O (EO) 22H | | | 1.00 | | | | | | | |
| Sodium p-toluenesulfonate | | | 5.00 | | | | | | | |
| Ultrapure water | | | 75.00 | 98.00 | 90.00 | 97.85 | 97.85 | 97.85 | 86.05 | 91.70 |
| HEDP/Component B (weight ratio) | | | | | | | | | 1/25 | 1/4 |
| pH (25° C.) | | | 13.0 | *¹10.0 | *¹10.0 | 10.0 | 10.0 | 10.0 | 9.8 | 9.8 |
| Dilution fold upon evaluation of cleanability | | | 10 | 100 | 100 | 100 | 100 | 100 | 100 | 100 |

| Substrate to be | Surface Material | Cleaning Process | | Evaluation | | | | | | | |
|---|---|---|---|---|---|---|---|---|---|---|---|
| Substrate for recording media | Metal (Ni—P) | Brush-scrub cleaning | Cleanability of fine particles | X | Δ | X | Δ | ○ | ○ | Δ | Δ |
| | Glass (chemical reinforced glass) | | Cleanability of fine particles | Δ | X | X | X | Δ | Δ | Δ | Δ |
| Substrate for photomask | Metal (Cr) | Ultrasonic immersion cleaning | Cleanability of fingerprints (sebum) | Δ | X | Δ | X | Δ | Δ | Δ | Δ |
| | Glass (Silica glass) | | Cleanability of lubricant (grease) | X | X | X | X | Δ | Δ | Δ | Δ |
| | | | Cleanability of fingerprints (sebum) | Δ | X | Δ | X | Δ | Δ | Δ | Δ |
| | | | Cleanability of lubricant (grease) | X | X | Δ | X | Δ | Δ | Δ | Δ |
| Substrate for flat panel display (FPD) | Metal (ITO: Indium-Tin Oxide) | Ultrasonic immersion cleaning | Cleanability of fingerprints (sebum) | Δ | X | Δ | X | Δ | Δ | Δ | Δ |
| | | | Cleanability of lubricant (grease) | X | X | Δ | X | Δ | Δ | Δ | Δ |
| | Glass (non-alkaline glass) | | Cleanability of fingerprints (sebum) | Δ | X | Δ | X | Δ | Δ | Δ | Δ |
| | | | Cleanability of lubricant (grease) | X | X | Δ | X | Δ | Δ | Δ | Δ |

*¹was pH-adjusted with ammonia.

It can be seen from the results shown in Tables 1 and 2 that the cleaning agent composition of the present invention is excellent in cleanability of fine particles and cleanability of oily soils. Among them, the cleaning agent composition of the embodiment 1 exhibits even more excellent effect in cleanability of fine particles.

INDUSTRIAL APPLICABILITY

According to the cleaning agent composition of the present invention featuring in the containment of a specified compound, and the cleaning using the cleaning agent composition, soils such as oily components, fine particles, and metal impurities deposited on a substrate for recording media, a substrate for photomask, or a substrate for a flat panel display can be efficiently cleaned and removed, thereby obtaining a surface quality with a high degree of cleanliness; therefore, the present invention can contribute to the improvement in yields of the manufactured article.

The invention claimed is:

1. A cleaning process for a substrate for recording media, a substrate for photomask, or a substrate for flat panel display, a surface of which at least comprises a metallic or glassy substrate moiety, with a cleaning agent composition, comprising the following step (a) or (b):
    (a) immersing the substrate for recording media, the substrate for photomask, or the substrate for flat panel display in the cleaning agent composition at a temperature of from 20° to 100° C., an immersion time of from 10 seconds to 30 minutes, and a frequency of ultrasonic waves of from 20 to 200 kHz; or
(b) ejecting the cleaning agent composition, thereby cleaning a surface of the substrate for recording media, the substrate for photomask, or the substrate for flat panel display, while contacting a cleaning brush with the surface in the presence of the ejected cleaning agent composition, wherein the cleaning agent composition is alkaline and is prepared by blending Component A and Component B,
wherein Component A is a copolymer compound satisfying at least the following (i) to (iii):
(i) a constituting unit A1 derived from acrylic acid is contained in an amount of 20% by mol or more of the entire constituting units,
(ii) the constituting unit A1 derived from acrylic acid and a constituting A2 derived from 2-acrylamide-2-methylpropanesulfonic acid are contained in a total amount of 90% by mol or more of the entire constituting units, and
(iii) the constituting unit A1 and the constituting unit A2 of the entire constituting units are in a content ratio [constituting unit A1 (% by mol)/constituting unit A2 (% by mol)] of from 91/9 to 95/5;
wherein Component B is $C_{12-14}O(EO)_5(PO)_{1.5}(EO)_5H$; and
wherein Component A and the Component B are contained in a total amount of from 0.001 to 5% by weight.

2. The cleaning process according to claim 1, wherein the substrate is a substrate of a recording media.

3. The cleaning process according to claim 2, wherein the surface of the substrate to be cleaned is Ni—P plated, is chemically reinforced glass, or is a cobalt alloy.

4. The cleaning process according to claim 1, wherein the substrate is a substrate of a photomask.

5. The cleaning process according to claim 4, wherein the surface of the substrate to be cleaned is glassy or metallic.

6. The cleaning process according to claim 5, wherein the metallic surface comprises chromium or molybdenum, and wherein the glassy substrate comprises silica glass.

7. The cleaning process according to claim 1, wherein the substrate is a substrate of a flat panel display.

8. The cleaning process according to claim 7, wherein the surface of the substrate to be cleaned is glassy or metallic.

9. The cleaning process according to claim 8, wherein the metallic surface is of an ITO film or an indium-tin oxide film, and wherein the glassy substrate comprises non-alkaline glass.

10. The cleaning process according to claim 1, wherein the copolymer compound of the component A has a weight-average molecular weight of from 500 to 150,000.

11. The cleaning process according to claim 1, wherein the copolymer compound of the component A has a weight-average molecular weight of from 1000 to 100,000.

12. The cleaning process according to claim 1, wherein the copolymer compound of the component A has a weight-average molecular weight of from 1000 to 50,000.

13. The cleaning process according to claim 1, wherein the component A is a salt.

14. The cleaning process according to claim 13, wherein the salt is an alkali metal salt or is a salt with a nitrogen-containing compound having a molecular weight of 300 or less.

15. The cleaning process according to claim 14, wherein the nitrogen-containing compound is an amino alcohol formed by adding ethylene oxide or propylene oxide to ammonia, an alkylamine, or a polyalkylpolyamine; or is a quaternary ammonium salt.

16. The cleaning process according to claim 1, wherein the cleaning agent composition has a pH of 11 to 14.

* * * * *